(12) United States Patent
Takayanagi et al.

(10) Patent No.: US 7,554,136 B2
(45) Date of Patent: Jun. 30, 2009

(54) MICRO-SWITCH DEVICE AND METHOD FOR MANUFACTURING THE SAME

(75) Inventors: Fumikazu Takayanagi, Tokyo (JP); Yoshiaki Moro, Tokyo (JP); Hirokazu Sanpei, Tokyo (JP)

(73) Assignee: Advantest Corporation, Tokyo (JP)

( * ) Notice: Subject to any disclaimer, the term of this patent is extended or adjusted under 35 U.S.C. 154(b) by 476 days.

(21) Appl. No.: 11/078,687

(22) Filed: Mar. 11, 2005

(65) Prior Publication Data

US 2005/0218530 A1    Oct. 6, 2005

Related U.S. Application Data

(63) Continuation of application No. PCT/JP03/11404, filed on Sep. 8, 2003.

(30) Foreign Application Priority Data

Sep. 13, 2002    (JP) ............................. 2002-268814

(51) Int. Cl.
*G01C 19/56* (2006.01)
(52) U.S. Cl. ................... 257/254; 257/415; 257/417; 257/420; 257/686; 257/704; 257/734; 257/690; 257/692; 257/693; 257/694; 257/695; 257/696; 257/697
(58) Field of Classification Search ................ 257/254, 257/411, 414, 421, 531, 600, 692–697, 686, 257/690, 704, 734
See application file for complete search history.

(56) References Cited

U.S. PATENT DOCUMENTS 5,420,916 A    5/1995    Sekiguchi 6,384,353 B1 *    5/2002    Huang et al. ................ 200/181
6,566,617 B1 *    5/2003    Suzuki et al. ............... 200/181

FOREIGN PATENT DOCUMENTS

| EP | 1 011 130 A1 | 6/1998 |
|---|---|---|
| JP | 7-128365 | 5/1995 |
| JP | 11-345106 | 12/1999 |
| JP | 2000-99428 | 4/2000 |
| JP | 2000-124251 | 4/2000 |
| JP | 2001-23497 | 1/2001 |
| JP | 2001-37763 | 2/2001 |

(Continued)

OTHER PUBLICATIONS

International Search Report dated Dec. 9, 2003 (3 pages).

(Continued)

*Primary Examiner*—M. Wilczewski
*Assistant Examiner*—Tsz K Chiu
(74) *Attorney, Agent, or Firm*—Osha • Liang LLP

(57) ABSTRACT

A micro device that is manufactured by semiconductor process and is electrically connected to outside for its operation. The micro device includes a circuit board, an electrode pad being provided on the circuit board, a lead substrate being provided substantially parallel to the circuit board, and a lead of conductive member being electrically connected to the electrode pad by being bent in a direction away from a surface of the lead substrate, one end of the lead being adhered to the lead substrate and the other end being a free end.

9 Claims, 6 Drawing Sheets

FOREIGN PATENT DOCUMENTS

| | | | |
|---|---|---|---|
| JP | 2002-289642 | | 10/2002 |
| WO | WO 02/088017 | * | 7/2002 |
| WO | WO 02/061781 A1 | | 8/2002 |
| WO | WO 2004/024618 A1 | | 3/2004 |

OTHER PUBLICATIONS

Patent Abstracts of Japan; Publication No. 11-345106 dated Dec. 14, 1999 (1 page).
Patent Abstracts of Japan; Publication No. 2000-099428 dated Apr. 7, 2000 (1 page).
Patent Abstracts of Japan; Publication No. 2001-037763 dated Feb. 13, 2001 (1 page).
Patent Abstracts of Japan; Publication No. 2000-124251 dated Apr. 28, 2000 (1 page).
Patent Abstracts of Japan; Publication No. 2002-289642 dated Oct. 4, 2002 (1 page).
Patent Abstracts of Japan; Publication No. 07-128365 dated May 19, 1995 (1 page).
Patent Abstracts of Japan; Publication No. 2001-023497 dated Jan. 26, 2001 (1 page).

* cited by examiner

MICRO-SWITCH DEVICE AND METHOD FOR MANUFACTURING THE SAME

The present application is a continuation application of PCT/JP03/11404 filed on Sep. 8, 2003, which claims priority from a Japanese Patent application No. 2002-268814 filed on Sep. 13, 2002, the entire contents of which are incorporated herein by reference for all purposes.

BACKGROUND OF THE INVENTION

1. Field of the Invention

The present invention relates to a micro device and a method for manufacturing the same having an air sealing structure.

2. Description of Related Art

With miniaturization of semiconductor devices recently, micro devices such as micro switches have been produced by semiconductor process as disclosed, for example, in Japanese Patent Laid-Open No. 2001-37763 and WO 02/061781.

FIGS. 1A to 1C show a conventional method for manufacturing a micro switch. At first, as shown in FIG. 1A, a part of the surface of Si substrate 100 is removed by etching to form a concave portion 102. Then, materials are laminated on a bottom face of the concave portion 102 by sputtering or evaporation to form a cantilever 106 of a bimorph structure having a heater 104. Further, conductive materials are laminated on the surface of the cantilever 106 and the side face of the concave portion 102 by sputtering or evaporation to form a lead 108 for supplying electric power to the heater 104. At this time, the lead 108 is formed from the heater 104 to the surface of Si substrate 100.

Next, as shown in FIG. 1B, the bottom face of the concave portion 102 of the Si substrate 100 on which the cantilever 106 is formed is removed by etching to secure a movable area of the cantilever 106. Then, as shown in FIG. 1C, a circuit board 112, on which an electrode pad 110 is formed, is prepared, and the Si substrate 100, in which the cantilever 106 is formed, is adhered to the circuit board 112 so as to seal the cantilever 106 using the Si substrate 100 and the circuit board 112. At this time, the lead 108 and the electrode pad 110 are joined by mechanical pressure bonding so that they are electrically connected to each other. Then, electric power from outside is supplied to the heater 104 via the electrode pad 110 and the lead 108, and thus the cantilever 106 is driven.

In the conventional method for manufacturing a micro switch, since the lead 108 and the electrode pad 110 are joined by mechanical pressure bonding to connect them each other electrically, there was a problem that impedance of a joint point fluctuates. In addition, in order to stably join the lead 108 and the electrode pad 110, depth precision of the concave portion 102 formed by etching and plane precision of an adhered face of the Si substrate 100 and the circuit board 112 are required very strictly.

SUMMARY OF THE INVENTION

Therefore, it is an object of the present invention to provide a micro device and a method for manufacturing the same that can solve the foregoing problems. The above and other objects can be achieved by combinations described in the independent claims. The dependent claims define further advantageous and exemplary combinations of the present invention.

According to the first aspect of the present invention, there is provided a micro device that is manufactured by semiconductor process and is electrically connected to outside for its operation. The micro device includes: a circuit board: an electrode pad being provided on the circuit board; a lead substrate being provided substantially parallel to the circuit board; and a lead of conductive member being electrically connected to the electrode pad by being bent in a direction away from a surface of the lead substrate, one end of the lead being adhered to the lead substrate and the other end being a free end.

The lead may be formed on the lead substrate by semiconductor process.

The circuit board may be provided to face a lower surface of the lead substrate, and the lead may be adhered to an upper surface of the lead substrate, and be bent from the upper surface toward the lower surface so that it is electrically connected to the electrode pad.

The lead substrate may have a through-hole formed therein, and the lead, of which one end is adhered to the lead substrate and the other end is extended in the direction of the through-hole, may be bent in a direction away from a surface of the lead substrate in the through-hole so that it is electrically connected to the electrode pad.

The lead and the electrode pad may be electrically connected to each other in the vicinity of a central axis of the through-hole.

The lead and the electrode pad may be electrically connected to each other in the vicinity of a central axis of the through-hole in the extending direction of the lead.

The lead and the electrode pad may be formed of the same conductive member.

According, to the, first aspect of the present invention, there is provided a method for manufacturing a micro device that is manufactured by semiconductor process and is electrically connected to outside for its operation. The manufacturing method includes: a lead substrate preparing step of preparing a lead substrate; a lead forming step of forming a lead of conductive member on the lead substrate; a lead substrate removing step of removing a part of the lead substrate so that one end of the lead is adhered to the lead substrate and the other end becomes a free end; a circuit board preparing step of preparing a circuit board on which an electrode pad is formed; an adhering step of adhering the lead substrate and the circuit board to each other so that the lead substrate faces the circuit board; and an electrically connecting step of electrically connecting the lead and the electrode pad by bending the lead in a direction away from a surface of the lead substrate so that it is in contact with the electrode pad.

The lead forming step may include a step of forming the lead on the lead substrate by means of semiconductor process.

The lead forming step may include a step of forming the lead on an upper surface of the lead substrate, the adhering step may include a step of adhering the lead substrate and the circuit board so that a lower surface of the lead substrate faces the circuit board, and the electrically connecting step may include a step of electrically connecting the lead and the electrode pad by bending the lead from the upper surface toward the lower surface of the lead substrate so that it is in contact with the electrode pad.

The lead forming step may include a step of forming a lead of conductive member on the lower surface of the lead substrate, the lead substrate removing step may include a step of forming a through-hole in the lead substrate so that the one end of the lead is adhered to the lead substrate and the other end becomes a free end, the adhering step may include a step of adhering the lead substrate and the circuit board so that the lower surface of the lead substrate faces the circuit board, and the electrically connecting step may include a step of electrically connecting the lead and the electrode pad by inserting a bonding tool into the through-hole and bending the lead so that it is in contact with the electrode pad from the upper surface toward the lower surface of the lead substrate.

The manufacturing method may further include: a cap substrate preparing step of preparing a cap substrate; and a sealing step of adhering the lead substrate and the cap substrate so as to block the through-hole from the upper surface of the lead substrate and sealing the lead using the lead substrate, the circuit board, and the cap substrate.

The electrically connecting step may include a step of inserting the bonding tool, which has substantially the same width as the through-hole, into the through-hole in the direction that is extended from the one end to the other end of the lead so that the lead is in contact with the electrode pad.

The summary of the invention does not necessarily describe all necessary features of the present invention. The present invention may also be a sub-combination of the features described above.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1A:
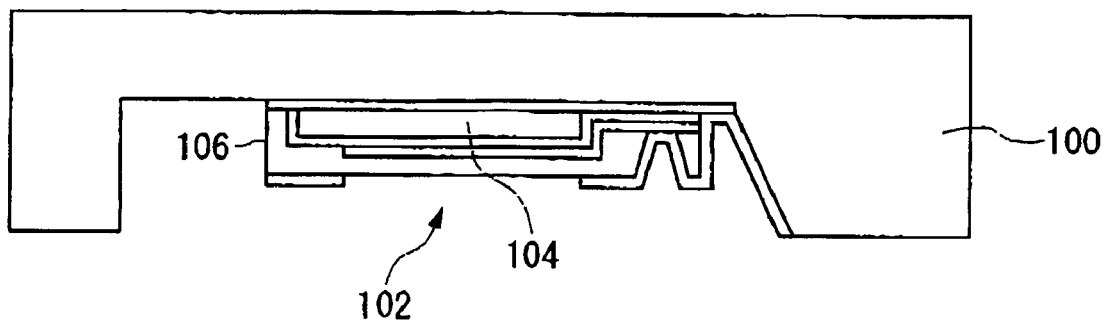
FIG. 1A is a view showing a method for manufacturing a conventional micro switch.
Figure 1B:
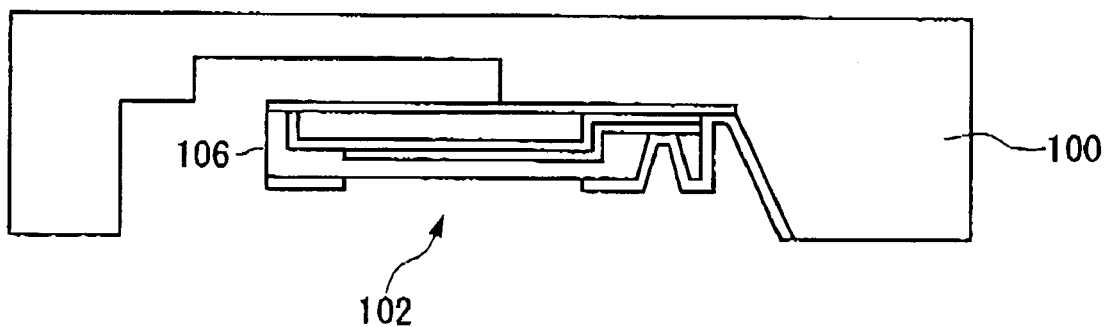
FIG. 1B is a view showing a method for manufacturing a conventional micro switch.
Figure 1C:
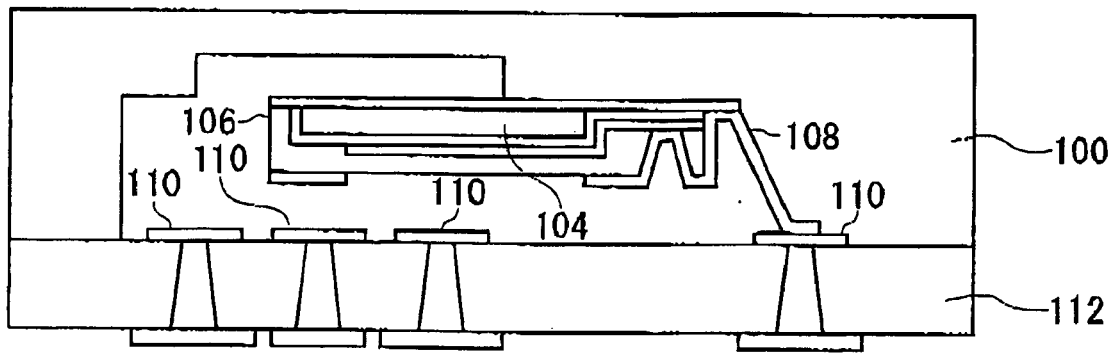
FIG. 1C is a view showing a method for manufacturing a conventional micro switch.
Figure 2A:
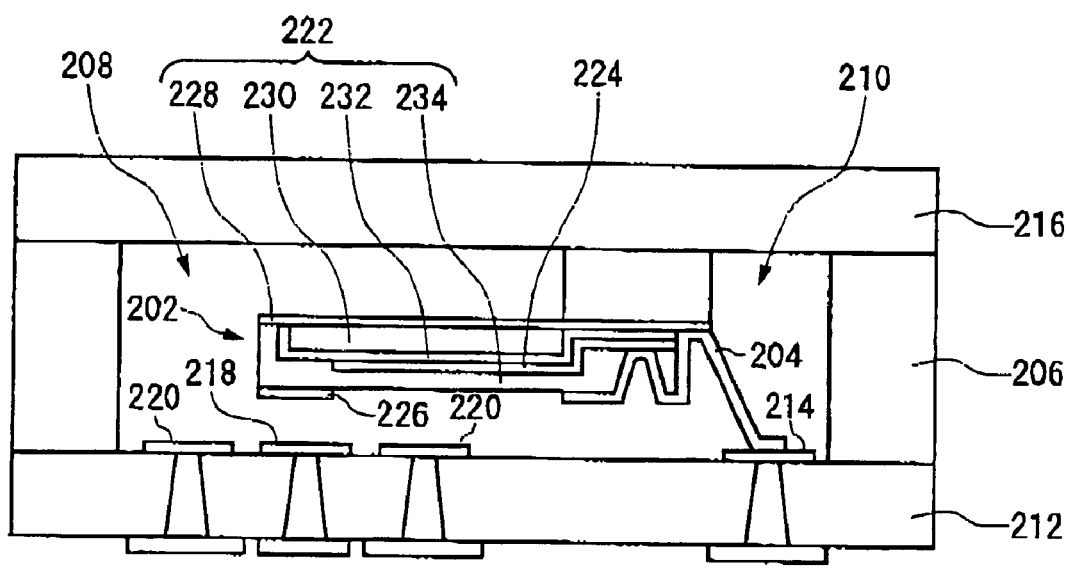
FIG. 2A is a sectional view of a micro switch.
Figure 2B:
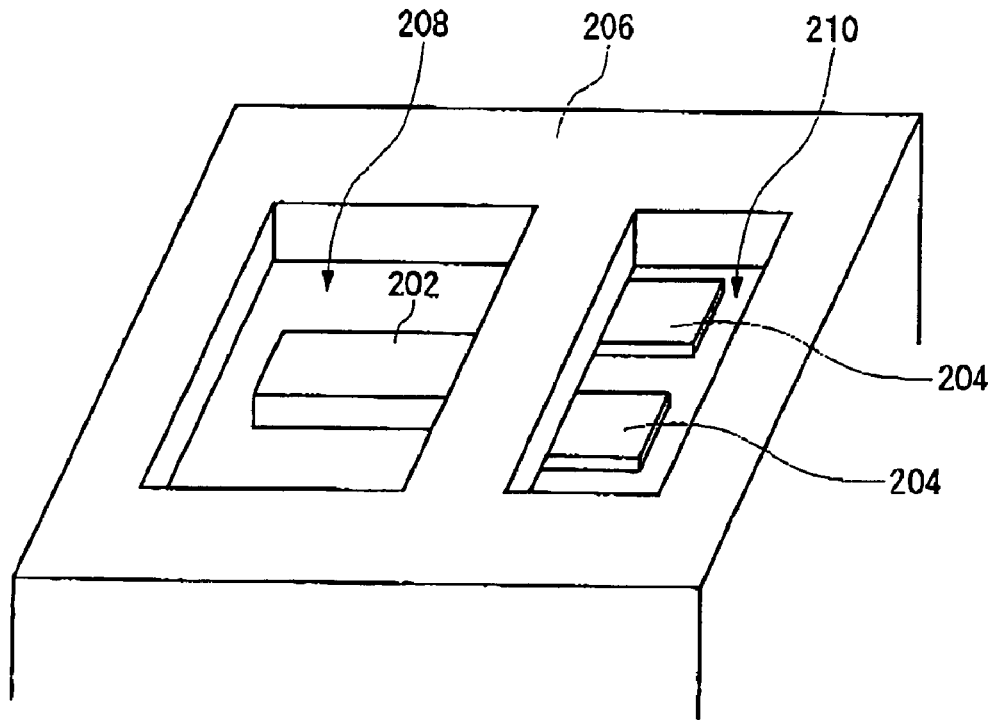
FIG. 2B is a perspective view of a substrate.

FIGS. 2A and 2B are views exemplary showing a configuration of a micro switch 200 according to an embodiment of the present invention. FIG. 2A shows a sectional view of the micro switch 200, and FIG. 2B shows a perspective view of a substrate 206 in which a movable portion 202 and a lead 204 are formed. The micro switch 200 is an example of a micro device of the present invention, and the substrate 206 is an example of a lead substrate of the present invention. In addition, a micro device of the present invention may be a micro machine such as a micro sensor.

The micro switch 200 is manufactured by semiconductor process, and is electrically connected to outside for its operation. The micro switch 200 includes a substrate 206 through which through-holes 208 and 210 are formed, a movable portion 202 of which one end is adhered to the substrate 206 and the other end is a free end on the through-hole 208, a circuit board 212 that is provided on a position away from the movable portion 202 substantially parallel to the substrate 206, an electrode pad 214 that is provided in the circuit board 212, a lead 204 of conductive member of which one end is adhered to the substrate 206 and the other end is extended in the direction of the through-hole 210 and is bent in a direction away from a surface of the substrate 206 so that it is electrically connected to the electrode pad 214, a substrate 216 that is an example of a cap substrate provided to seal the movable portion 202 using the substrate 206 and the circuit board 212, and fixed contacts and earth electrodes 220 that are provided on the circuit board 212. The other end of the movable portion 202 may be held within the through-hole 208, or may be held on a position being extended in the direction perpendicular to the substrate 206 from the through-hole 208 to outside of the substrate 206.

The through-hole 208 and through-hole 210 are formed by removing a part of the substrate 206 from an upper surface of the substrate 206. In addition, the circuit board 212 is provided to face a lower surface of the substrate 206, and the substrate 216 is provided to block the through-holes 208 and 210 over the upper surface of the substrate 206.

The movable portion 202 includes a bimorph 222 that is an example of an actuator, a heater 224 for heating the bimorph 222, and a movable contact 226 that is provided in a leading edge of the bimorph 222. The bimorph 222 is formed of a plurality of materials having a coefficient of thermal expansion different from one another by laminated structure, and particularly includes $SiO_2$ layer 228, Al layer 230, $SiO_2$ layer 232, and $SiO_2$ layer 234. The heater 224 is formed between the $SiO_2$ layer 232 and the $SiO_2$ layer 234 by laminating Cr layer, Pt layer, and Cr layer in turn. The movable portion 202 may have a piezoelectric element as an example of an actuator, or may have an electrostatic electrode for driving the movable portion 202 by electrostatic force.

The lead 204 and the electrode pad 214 are electrically connected to each other in the vicinity of a central axis of the through-hole 210. The lead 204 and the electrode pad 214 are electrically connected to each other in the vicinity of a central axis of the through-hole 210 in the extending direction of the lead 204. It is preferable that the lead 204 is formed on the substrate 206 by semiconductor process. In addition, it is preferable that the lead 204 and the electrode pad 214 are formed of the same conductive member such as Au. Since the lead 204 and the electrode pad 214 are formed of the same conductive member, the lead 204 and the electrode pad 214 are stably connected to each other from mechanical and electric views.

Figure 3A:
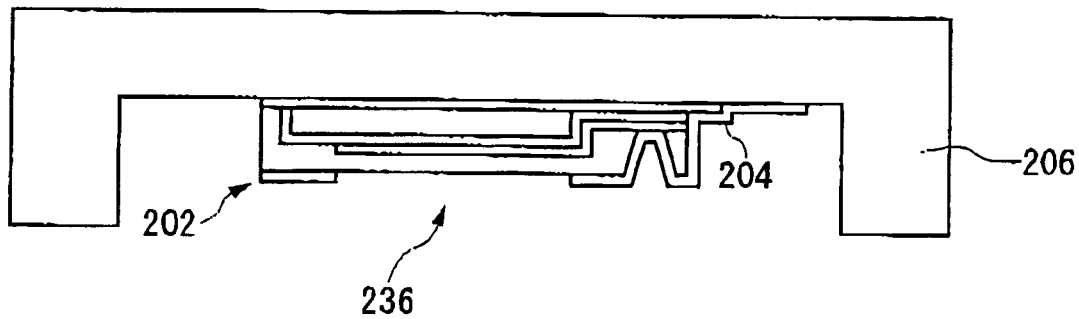
FIG. 3A is a view showing a substrate preparing step, a movable portion forming step, and a lead forming step.
Figure 3B:
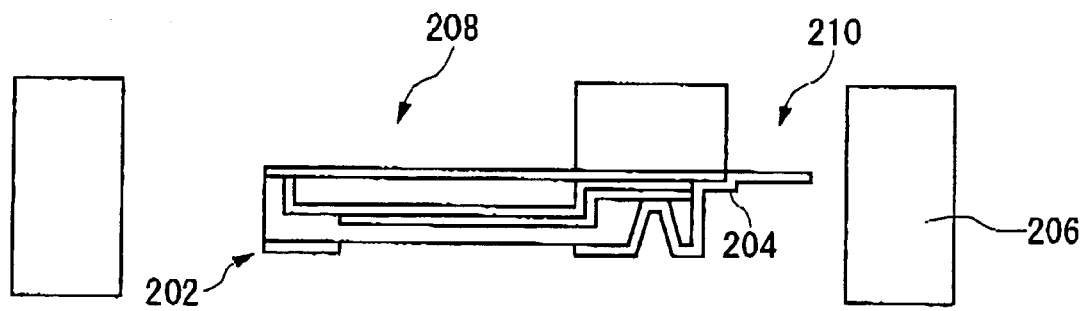
FIG. 3B is a view showing a lead substrate removing step.
Figure 3C:
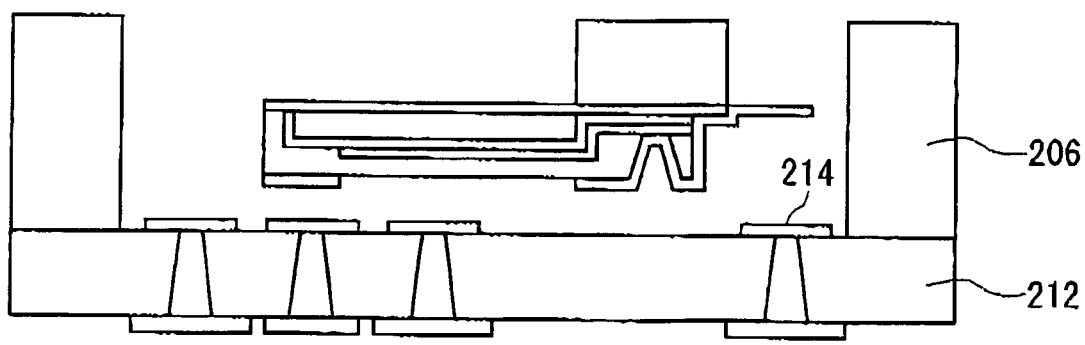
FIG. 3C is a view showing a preparing step and an adhering step for a circuit board.
Figure 4A:
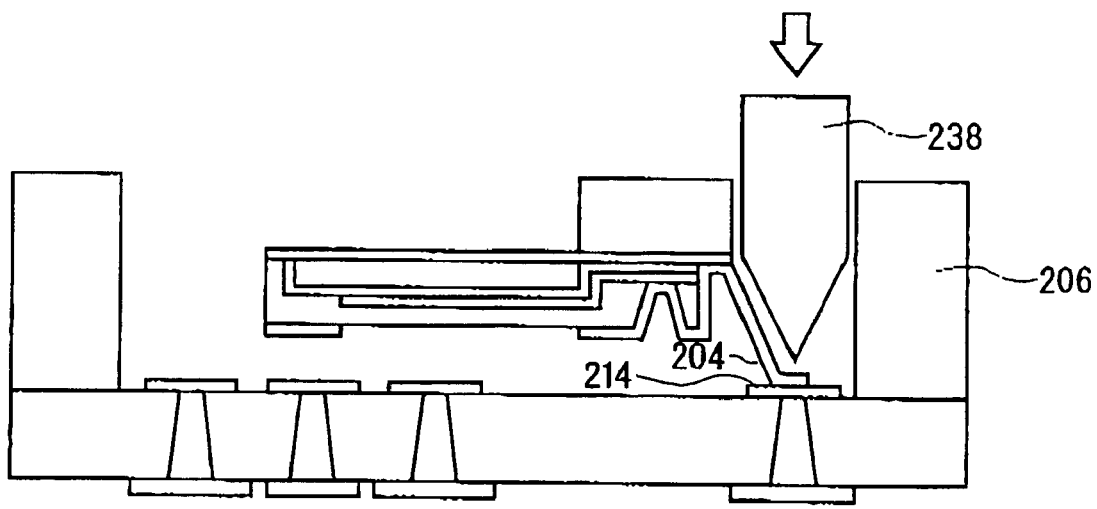
FIG. 4A is a view showing an electrically connecting step.
Figure 4B:
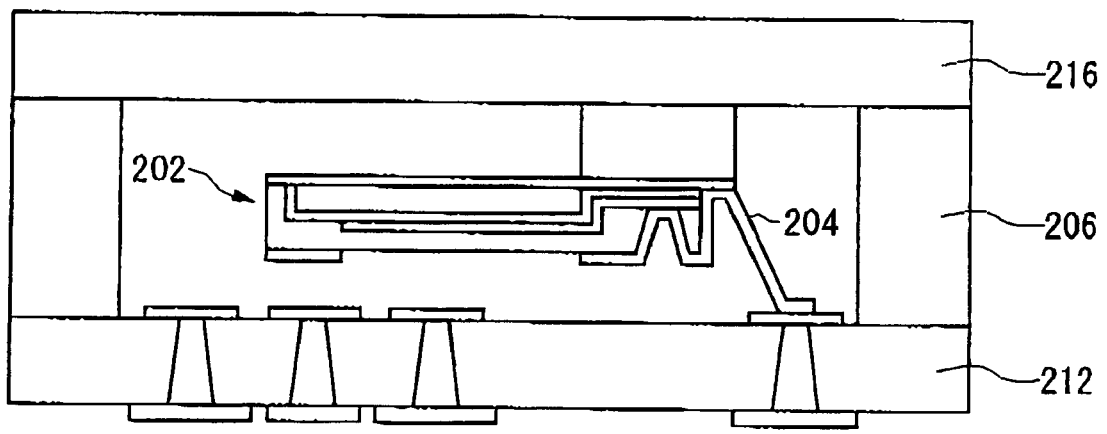
FIG. 4B is a view showing a preparing step and a sealing step for a substrate.

FIGS. 3A to 4B are views exemplary showing a method for manufacturing the micro switch 200. FIG. 3A is a view showing a substrate preparing step, a movable portion forming step, and a lead forming step. FIG. 3B is a view showing a lead substrate removing step. FIG. 3C is a view showing a preparing step and an adhering step for the circuit board. FIG. 4A is a view showing an electrically connecting step. FIG. 4B is a view showing a preparing step and a sealing step for the substrate.

At first, as shown in FIG. 3A, in the substrate preparing step, the substrate 206 that is Si substrate is prepared. Then, a part of the lower surface of the substrate 206 is removed by etching to form a concave portion 236. Then, in the movable portion forming step, materials are laminated on a bottom face of the concave portion 236 by sputtering or evaporation to form the movable portion 202 on the lower surface of the substrate 206. Then, in the lead forming step, conductive materials are laminated on an upper surface of the movable portion 202 and the bottom face of the concave portion 236 by sputtering or evaporation to form the lead 204 on the lower surface of the substrate 206.

Next, as shown in FIG. 3B, in the lead substrate removing step, the through-hole 208 is formed in the substrate 206 by removing a part of the substrate 206 so that one end of the movable portion 202 is adhered to the substrate 206 and the other end is a free end, and also the through-hole 210 is formed in the substrate 206 so that one end of the lead 204 is adhered to the substrate 206 and the other end becomes a free end. Particularly, a resist layer is formed on the upper surface of the substrate 206, and a part of the substrate 206 is removed from the upper surface of the substrate 206 by dry etching using the resist layer as an etching mask. At this time, the $SiO_2$ layer 228 in contact with the substrate 206 that is Si substrate acts as an etching stopper. In this way, the through-hole 208 is formed by removing the substrate 206 that is Si substrate until the $SiO_2$ layer 228 is exposed. Preferably, the through-holes 208 and 210 may also be formed by wet etching, or may be formed by anisotropic etching.

Since the substrate 206 is etched from the upper surface that is a rear face of the surface on which the movable portion 202 is provided so as to form the through-holes 208 and 210, it is possible to substantially uniform the thickness of the substrate 206 that is removed by etching over the whole area that forms the through-holes 208 and 210. Thus, since an amount of etching can be adjusted with high precision and the size of the through-holes 208 and 210 can be adjusted with high precision, the length of portion in which the movable portion 202 is extended to the through-hole 208, the length of portion in which the lead 204 is extended to the through-hole 210, and the size of sealed portion that is a space surrounded by the substrate 206, the circuit board 212, and the substrate 216 can be adjusted with high precision, and thus these portions can be manufactured with high precision. Therefore, it is possible to reduce fluctuation of the necessary electric power for every device of the micro switch 200 to provide a desired displacement to the movable portion 202.

Next, as shown in FIG. 3C, in the circuit board preparing step, the circuit board 212 on which the electrode pad 214 is formed is prepared. Then, in the adhering steps the substrate 206 and the circuit board 212 are adhered to each other so that the lower surface of the substrate 206 faces the circuit board 212. When the circuit board 212 is a glass substrate, the substrate 206 and the circuit board 212 may be joined to each other by anodic bonding. In addition, metal films may respectively be formed on a joint surface between the substrate 206 and the circuit board 212 to join the substrate 206 and the circuit board 212 to each other by way of metallic bond.

Next, as shown in FIG. 4A, in the electrically connecting step, a bonding tool 238 is inserted into the through-hole 210 from the upper surface toward the lower surface of the substrate 206, and the lead 204 is bent in the direction away from a surface of the substrate 206 so that it is in contact with the electrode pad 214. Thus, the lead 204 and the electrode pad 214 are electrically connected to each other. At this time, in the direction extended from one end to the other end of the lead 204, the bonding tool 23, which has substantially the same width as the through-hole 210, may be inserted into the through-hole 210 so that the lead 204 is in contact with the electrode pad 214. In addition, in an in-plane direction of the substrate 206, the bonding tool 238, which has substantially the same cross-section as the through-hole 210, may be inserted into the through-hole 210 so that the lead 204 is in contact with the electrode pad 214. The bonding tool 238 is, e.g., an ultrasonic wedge, and thus the lead 204 may be pressure-bonded to the electrode pad 214 while supplying ultrasonic vibration to the lead 204. In this way, the lead 204 and the electrode pad 214 are bonded by pressure directly. Thus, it is possible to electrically connect the lead 204 and the electrode pad 214 securely.

Next, as shown in FIG. 4B, in the substrate preparing step, the substrate 216 is prepared. Then, in the sealing step, the substrate 206 and the substrate 216 are adhered to each other to block the through-holes 208 and 210 over the upper surface of the substrate 206, and the movable portion 202 and the lead 204 are sealed by the substrate 206, the circuit board 212, and the substrate 216. When the substrate 216 is a glass substrate, the substrate 206 and the substrate 216 may be joined to each other by anodic bonding. In addition, metal films may respectively be formed on a joint surface between the substrate 206 and the substrate 216 to join the substrate 206 and the substrate 216 to each other by way of metallic bond.

Figure 5A:
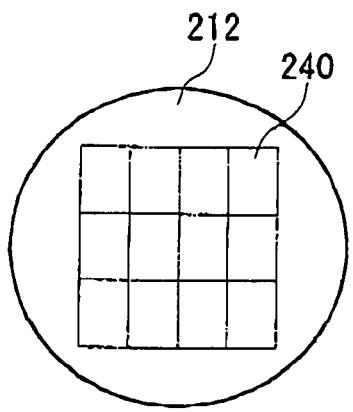
FIG. 5A is an overall view of a circuit board.
Figure 5B:
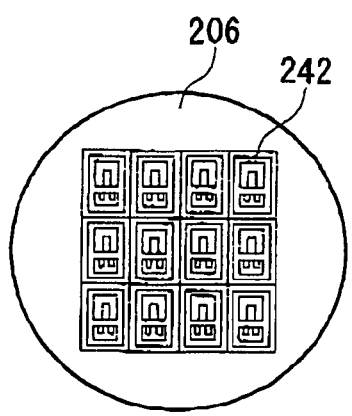
FIG. 5B is an overall view of a substrate.
Figure 5C:
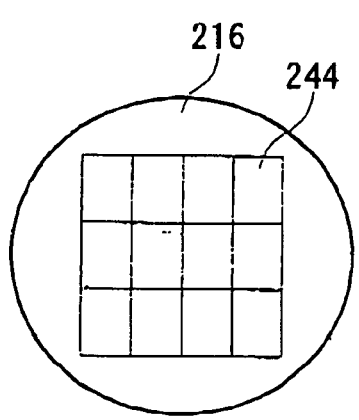
FIG. 5C is an overall view of another substrate.
Figure 5D:
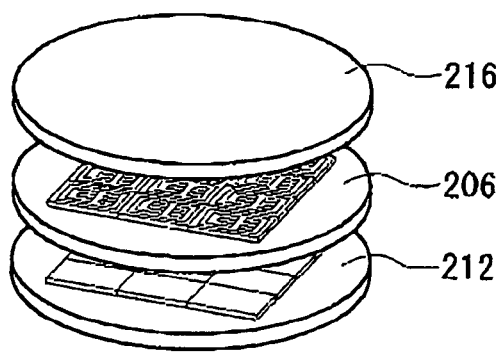
FIG. 5D is a view showing an adhering step, a sealing step, and an electrically connecting step.
Figure 5E:
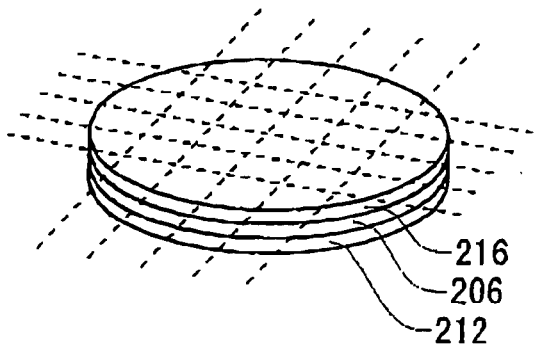
FIG. 5E is a view showing a cutting step.

FIGS. 5A to 5E are views exemplary showing a method for manufacturing the micro switch 200. FIG. 5A is an overall view of the circuit board 212. FIG. 5B is an overall view of the substrate 206. FIG. 5C is an overall view of the substrate 216. FIG. 5D is a view showing an adhering step, a sealing step, and an electrically connecting step. FIG. 5E is a view showing a cutting step.

As shown in FIG. 5A, in the circuit board 212, the plurality of electrode pad 214, fixed contact 218, and earth electrode 220 shown in FIGS. 2A and 2B is respectively formed on each of a plurality of areas 240 corresponding to each of the plurality of micro switches 200. In addition, as shown in FIG. 5B, in the movable portion forming step, in the substrate 206, the plurality of movable portion 202 and lead 204 shown in FIGS. 2A and 2B is respectively formed on each of a plurality of areas 242 corresponding to each of the plurality of micro switches 200. Further, in the lead substrate removing step, the plurality of through-holes 208 is respectively formed in the substrate 206 for each of the plurality of movable portions 202, and the plurality of through-holes 210 is respectively formed in the substrate 206 for each of the plurality of leads 204. Moreover, as shown in FIG. 5C, the substrate 216 that includes a plurality of areas 244 corresponding to each of the plurality of micro switches 200 is prepared.

Then, as shown in FIG. 5D, in the adhering step, the circuit board 212 on which the plurality of electrode pads 214 is formed and the substrate 206, on which the plurality of movable portions 202 and leads 204 are formed, are adhered to each other. Then, in the electrically connecting step, the bonding tool 238 is inserted into the plurality of through-holes 210, and the plurality of leads 204 and the plurality of electrode pads 214 are electrically connected to one another respectively. At this time, it is preferable to electrically connect the plurality of leads 204 and the plurality of electrode pads 214 at the same time using the bonding tool 238 having the shape in which the leading edge of the tool is inserted into each of the plurality of through-holes 210. Then, in the sealing step, the substrate 206 and the substrate 216 are adhered to each other in order to respectively seal the plurality of movable portions 202 and leads 204.

Next, as shown in FIG. 5E, in the cutting step after the sealing step, when the plurality of movable portions 202 and leads 204 has been sealed, the substrate 206, the circuit board 212, and the substrate 216 are cut by dicing to make the micro switches 200 of chip structure respectively. In the cutting step, since the cutting is performed pouring water on the surface of the substrate in order to prevent temperature rise, the cutting is performed after the sealing step, thereby the movable portion 202 and the lead 204 may be protected from water pressure.

Figure 6A:
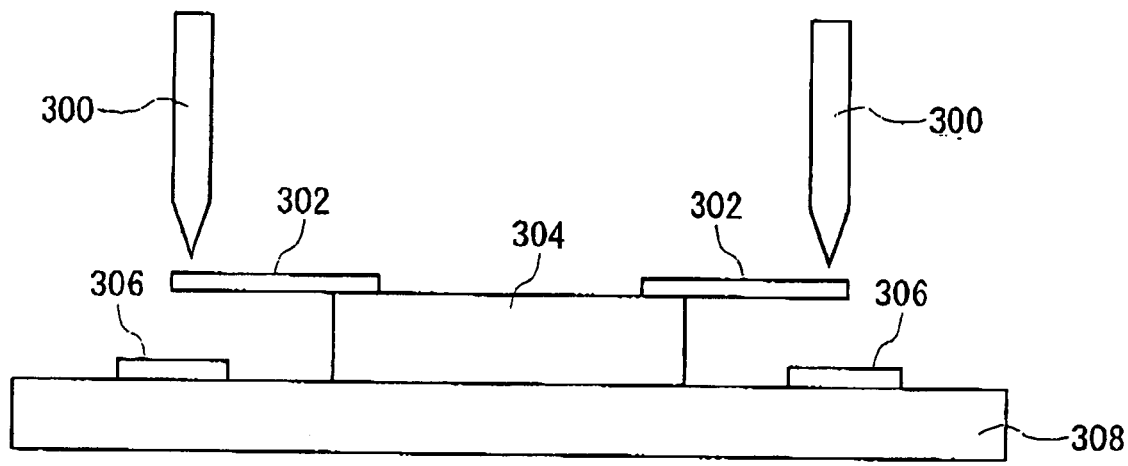
FIG. 6A is a view showing another example of a forming step and an adhering step for a lead.
Figure 6B:
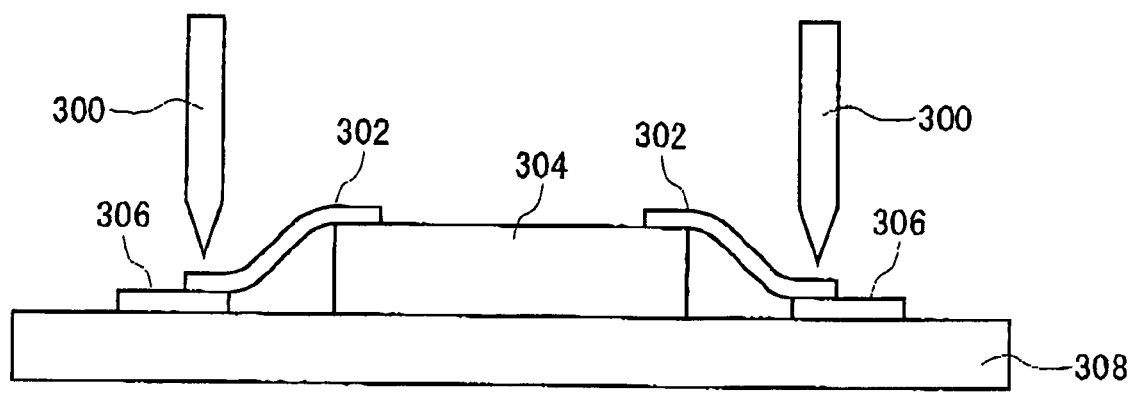
FIG. 6B is a view showing another example of an electrically connecting step.

FIGS. 6A and 6B are views showing another example of a method for manufacturing the micro device. FIG. 6A is a view showing another example of a forming step and an adhering step for a lead. FIG. 6B is a view showing another example of an electrically connecting step. Since each step included in a method for manufacturing the micro device is same as each step described in FIGS. 1A to 5E except for the following description, the description for the same steps will be omitted.

The micro device of the present example includes a circuit board 308, a electrode pad 306 that is provided on the circuit board, a substrate 304 that is provided substantially parallel to the circuit board 308, and a lead of conductive member that is electrically connected to the electrode pad 306 by being bent in a direction away from a surface of the substrate 304, one end of which is adhered to the substrate 304 and the other end becomes a free end. For example, the substrate 304 is a substrate on which a large-scale integrated circuit is formed, and the lead 302 is a terminal of the large-scale integrated circuit. Moreover, the substrate 304 is an example of a lead substrate of the present invention.

As shown in FIG. 6A, in the lead forming step, the lead 302 is formed on the upper surface of the substrate 304. Then, in the adhering step, the substrate 304 and the circuit board 308 are adhered to each other by joining the lower surface of the substrate 304 to the circuit board 30B using anodic bonding, metal junction, junction by adhesive, and the like. That is, the lead 302 in the substrate 304 is provided on an opposite surface of a joint surface between the substrate 304 and the circuit board 308. Therefore, when the substrate 304 and the circuit board 308 is joined to each other, substantially the same clearance as the thickness of the substrate 304 is formed between the lead 302 and the electrode pad 306. Next, as shown in FIG. 6B, in the electrically connecting step, since the lead 302 is bent by the bonding tool 300 from the upper surface toward the lower surface of the substrate 304 so that it is in contact with the electrode pad 306, the lead 302 and the electrode pad 306 are electrically connected to each other. In this way, since the lead 302 and the electrode pad 306 are bonded by pressure directly, it is possible to connect an electronic device such as a large-scale integrated circuit to a circuit board simply and securely.

As is apparent from the above descriptions, according to the present invention, it is possible to provide a micro device that is electrically connected to outside stably and a method for manufacturing the same.

Although the present invention has been described by way of an exemplary embodiment, it should be understood that those skilled in the art might make many changes and substitutions without departing from the spirit and the scope of the present invention. It is obvious from the definition of the appended claims that embodiments with such modifications also belong to the scope of the present invention.

What is claimed is:

1. A micro device that is manufactured by semiconductor process and is electrically connected to outside for its operation, comprising:
   a circuit board;
   an electrode pad being provided on said circuit board;
   a lead substrate being provided substantially parallel to said circuit board;
   a lead of conductive member being electrically connected to said electrode pad by being bent in a direction away from a surface of said lead substrate, a portion of said lead being adhered to said lead substrate and one end being a free end; and
   a cap substrate provided over an upper surface of said lead substrate and, together with the lead substrate, defining a through-hole in which the free end of said lead moves.

2. The micro device as claimed in claim 1, wherein said lead is formed on said lead substrate by semiconductor process.

3. The micro device as claimed in claim 1, wherein said circuit board is provided to face a lower surface of said lead substrate, and said lead is adhered to an upper surface of said lead substrate, and is bent from the upper surface toward the lower surface so that it is electrically connected to said electrode pad.

4. The micro device as claimed in claim 1, wherein said lead substrate has a through-hole formed therein, and said lead, of which the other end is extended in the direction of the through-hole, is bent in a direction away from a surface of said lead substrate in the through-hole so that it is electrically connected to said electrode pad.

5. The micro device as claimed in claim 4, wherein said lead and said electrode pad are electrically connected to each other in the vicinity of a central axis of the through-hole.

6. The micro device as claimed in claim 4, wherein said lead and said electrode pad are electrically connected to each other in the vicinity of a central axis of the through-hole in the extending direction of said lead.

7. The micro device as claimed in claim 1, wherein said lead and said electrode pad are formed of the same conductive member.

8. The micro device as claimed in claim 1, wherein said lead substrate and said cap substrate are adhered to each other.

9. The micro device as claimed in claim 1, wherein said cap substrate is a glass substrate.

\* \* \* \* \*